United States Patent [19]
Beswick

[11] Patent Number: 5,572,121
[45] Date of Patent: Nov. 5, 1996

[54] METAL DETECTOR INCLUDING A METAL SCREENING FOR PRODUCING A SECONDARY MAGNETIC FIELD TO REDUCE THE METAL FREE ZONE

[75] Inventor: Ivan Beswick, Lancashire, United Kingdom

[73] Assignee: Safeline Limited, Salford, United Kingdom

[21] Appl. No.: 434,114

[22] Filed: May 2, 1995

Related U.S. Application Data

[63] Continuation of Ser. No. 962,189, filed as PCT/GB91/01066, Jul. 1, 1991 publsihed as WO92/00534, Jan. 9, 1992.

[30]   Foreign Application Priority Data

Jun. 29, 1990 [GB]   United Kingdom .................. 9014496

[51] Int. Cl.$^6$ .......................... G01N 27/72; H01F 27/36; G01R 33/12
[52] U.S. Cl. .......................... 324/234; 324/243; 324/239; 324/225; 340/551; 340/572; 336/84 C
[58] Field of Search ..................... 324/225, 232, 324/234, 236, 239, 243; 340/551, 572; 336/84 R, 84 C, 84 M; 361/180

[56]   References Cited

U.S. PATENT DOCUMENTS

| | | | |
|---|---|---|---|
| 2,315,045 | 3/1943 | Breitenstein | 177/311 |
| 3,020,470 | 2/1962 | Shawhan et al. | 324/3 |
| 3,509,469 | 4/1970 | Strange | 328/1 |
| 4,012,690 | 3/1977 | Heytow | 324/41 |
| 4,451,812 | 5/1984 | Vescovi et al. | 336/84 C |
| 4,949,452 | 8/1990 | Moran | 336/84 C X |
| 4,978,920 | 12/1990 | Mansfield et al. | 324/318 |
| 5,066,937 | 11/1991 | Moran | 336/84 C |
| 5,130,697 | 7/1992 | McGinn | 340/551 |
| 5,293,117 | 3/1994 | Hwang | 324/232 |

FOREIGN PATENT DOCUMENTS 0096568  12/1983  European Pat. Off. .

*Primary Examiner*—Sandra L. O'Shea
*Assistant Examiner*—J. M. Patidar
*Attorney, Agent, or Firm*—Levine & Mandelbaum

[57]   ABSTRACT

A metal detector comprise a coiled conductor located within a metal enclosure operative to provide an a.c. generated primary electromagnetic field. Metal screening is provided adjacent the coil so as to provide a secondary induced magnetic field which opposes the primary electromagnetic field so as to significantly reduce the metal free zone.

10 Claims, 5 Drawing Sheets

METAL DETECTOR INCLUDING A METAL SCREENING FOR PRODUCING A SECONDARY MAGNETIC FIELD TO REDUCE THE METAL FREE ZONE

This application is a continuation of application Ser. No. 07/962,189, filed as PCT/GB91/01066, Jul. 1, 1991 published as WO92/00534, Jan. 9, 1992.

BACKGROUND OF THE INVENTION

This invention relates to a metal detector.

Metal detectors are used in many industries for the detection of metal contaminants.

In the food and pharmaceutical industries metal contamination is a serious problem, and high performance is required in order to detect very small particles of all types of metal, and to effectively remove the metal from the product in order to safeguard the consumer.

Metal detectors are also used in other industries such as plastics, timber, and quarrying etc., for the protection of machinery. They are also used in airports and other establishments as a means of security for the detection of weapons.

In general metal detectors can be divided into two types:
1. The Enclosed Detector is an enclosure or box (usually metal) with a central hole or aperture through which the product to be tested is passed. The aperture can be round, square, rectangular or any other shape. This type of detector is very sensitive to the presence of metal inside the aperture.
2. The Surface Detector is an enclosure with one external surface that is sensitive to the presence of metal.

A conventional metal detector transducer comprises a balanced coil arrangement in the form of an AC bridge mounted at the centre of a metal box. A large distance between the coil and metal box is considered essential for high performance and minimising disturbance signals resulting from vibration effects and thermal or ageing effects. Vibration effects cause relative movement of the metal box and coil and the thermal or ageing effects can cause disturbance in the electrical balance of the coil system. Reduction in the distance from the coil to the metal box leads to exponential increase in these disturbance effects. It has therefore previously been thought undesirable to provide any metallic material within the vicinity of the aperture. Metal detector design principles have always been to keep metal as far away from the coils as possible.

These known metal detectors suffer from the drawback that they are sensitive to stationary metal, and even more so to moving metal, in areas outside of the detection zone. For an enclosed detector the detection zone is inside the aperture, and for a surface detector the detection zone is adjacent the sensitive surface.

Known metal detectors must therefore have an area outside of the detection zone that is free from metal. The area is known as the 'metal free zone' or MFZ.

For high performance detectors this metal free zone can be very large, such that in order to fit a detector onto a conveyor, or a machine, a metal free zone is required which could be as much as five times the actual size of the metal detector itself. The size of the metal free zone may be calculated using the following equation:

Metal free zone = $1.5 \times AH$ (for stationary metal)
 = $2.0 \times AH$ (for moving metal)

where AH=Aperture Height or Diameter.

This requirement for a larger metal free area seriously effects where metal detectors can be used. It very often results in high installation costs due to the additional space required and in some instances rules out the possibility of installing a metal detector.

Also conventional metal detectors are disturbed by electrical loops in the supporting metal framework and great care has to be taken in the design of this framework to electrically isolate different sections to avoid this effect.

This 'loop effect' can extend over far greater distances than the MFZ effect and can be as great as 10 times the aperture height or diameter.

The effect of an electrical loop which varies in its resistance owing to vibration effects or because of metal balls rotating in the ball race of a roller on a conveying system is to trigger the metal detector and cause such disturbance that the performance is seriously impaired.

Metal detectors in close proximity to each other operating at the same frequency will be disturbed by a 'cross talk' effect which impairs sensitivity.

The present invention has been made from a consideration of these problems.

SUMMARY OF THE INVENTION

According to the present invention there is provided a metal detector comprising a coiled conductor, operative to be connected to an a.c. power supply so as to provide an a.c. generated primary electromagnetic field, the detector further comprising means for generating a secondary magnetic field that is opposed to the primary field, the means for generating the secondary field being stationary, and at least a part of the means for generating the secondary field being located within the primary field and being located adjacent the coiled conductor, characterised in that the coiled conductor is located within a metal enclosure and at least a part of the means for generating the secondary magnetic field extends between the coiled conductor and the metal enclosure.

In a preferred embodiment of this invention the primary coil conductor is provided inside a metal box. Apertures are provided in opposite parts of the box, these apertures being aligned and of a similar size to the aperture through the primary coil. A means of generating a graded, opposing, electromagnetic a.c. field is located at each side of the primary coil and can extend to the apertures of the box or beyond.

The means of generating an opposing (and graded) a.c. electromagnetic field can be achieved, for example, in one of the following ways:
1. A number of coils of conductive material (copper wire) are wound on each side of the primary field generating coil. The coils on each side consist of a number of separate coils each being operative to be energised at the same frequency as the primary field coil, but of opposite polarity and graded in intensity (current) and phase. The grading of the intensity (current) and phase relative to the distance from the coil to the primary field generating coil determines the loci of the primary field.
2. A number of individual coils are wound on each side of the primary field generating coil and all are short circuited and grounded. The coils can be in a single layer or multiple layer format and cover in a specific area of the aperture.

By means of the induced currents in each of these windings an opposing electromagnetic field is generated in accordance with Lenz's Law.

The intensity and grading can be controlled by the impedance of each coil and its position relative to the primary field coil. By these means the required primary field loci can be tailored.

3. Solid metal plates, tubes or screens, can be used, of such size, shape and position in relation to the primary field coil that the induced eddy currents generate an opposing field and by these means the required primary field loci can be tailored.

The detector in accordance with the present invention reduces the external electromagnetic field outside of the detection zone such that the metal free zone is reduced or eliminated- This reduction in the metal free zone can be controlled by the design parameters of the metal detector.

The range of control accorded by the invention is such that detectors can be designed to have a positive, a zero or a negative metal free zone.

The design parameters of the invention can also be controlled such that the electromagnetic field in the detection zone is not reduced by the technique and therefore sensitivities are not impaired.

The interaction of the secondary opposing field with the primary field limits the distance or range that the primary field extends to, from the coil, and a loci is generated in space beyond which the primary field is nulled.

The position and shape of this loci can be controlled by the geometry of the means of generating the opposing field and the grading of the intensity of the opposing field, at all points along its length. The loci can be so controlled to prevent the primary field from extending beyond the apertures of the metal box and without reducing the intensity of the primary field within the area of the detection zone. By these means a metal detector can maintain a high detection sensitivity within the detection zone, and will not be disturbed from this high sensitivity by large metal objects moving or stationary outside of the boundaries of the metal box. The effects of electrical 'loops' and 'cross talk' are also eliminated.

The opposing field has to be 'ultra stable' in its electrical and mechanical properties as any disturbance will produce a signal indistinguishable from that from a piece of metal passing through the detector and so cause false alarms.

Electrically the opposing field has to be graded in intensity along its length to provide the required loci. The field is also complex and has to be not only of the correct amplitude but also of the correct phase, and must be ultra-stable in both phase and amplitude.

Mechanically, the opposing field, or the means by which it is generated must not be able to move physically relative to the primary field or to the metal box even when subjected to severe vibration levels.

The opposing field and the resultant loci must not reduce the primary field within the detection zone otherwise the sensitivity of the detector will be impaired.

In order that the invention may be more readily understood a specific embodiment thereof will now be described by way of example only with reference to the accompanying drawings in which:

DESCRIPTION OF THE DRAWINGS

In the drawings similar reference numerals are used to represent like parts.

DESCRIPTION OF THE PREFERRED EMBODIMENT

Figure 1:
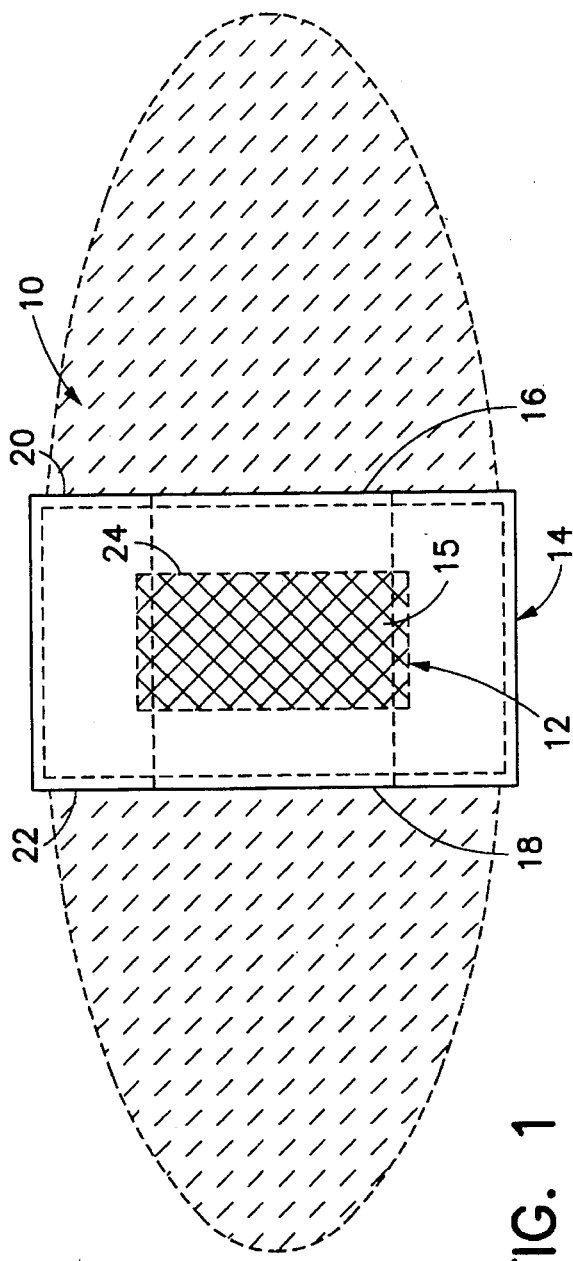
FIG. 1 is an end view of a standard metal detector showing the metal free zone requirements for achieving full sensitivity.
Figure 2:
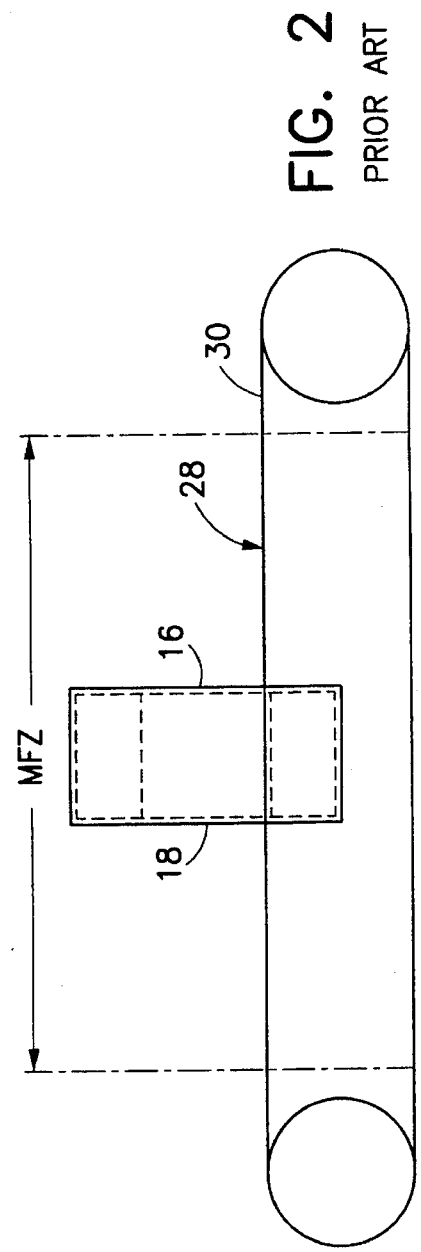
FIG. 2 is a side view of a standard detector mounted onto a conveyor showing how the length of the conveyor and the insertion space in a production line is limited by the large metal free zone requirement.
Figure 3:
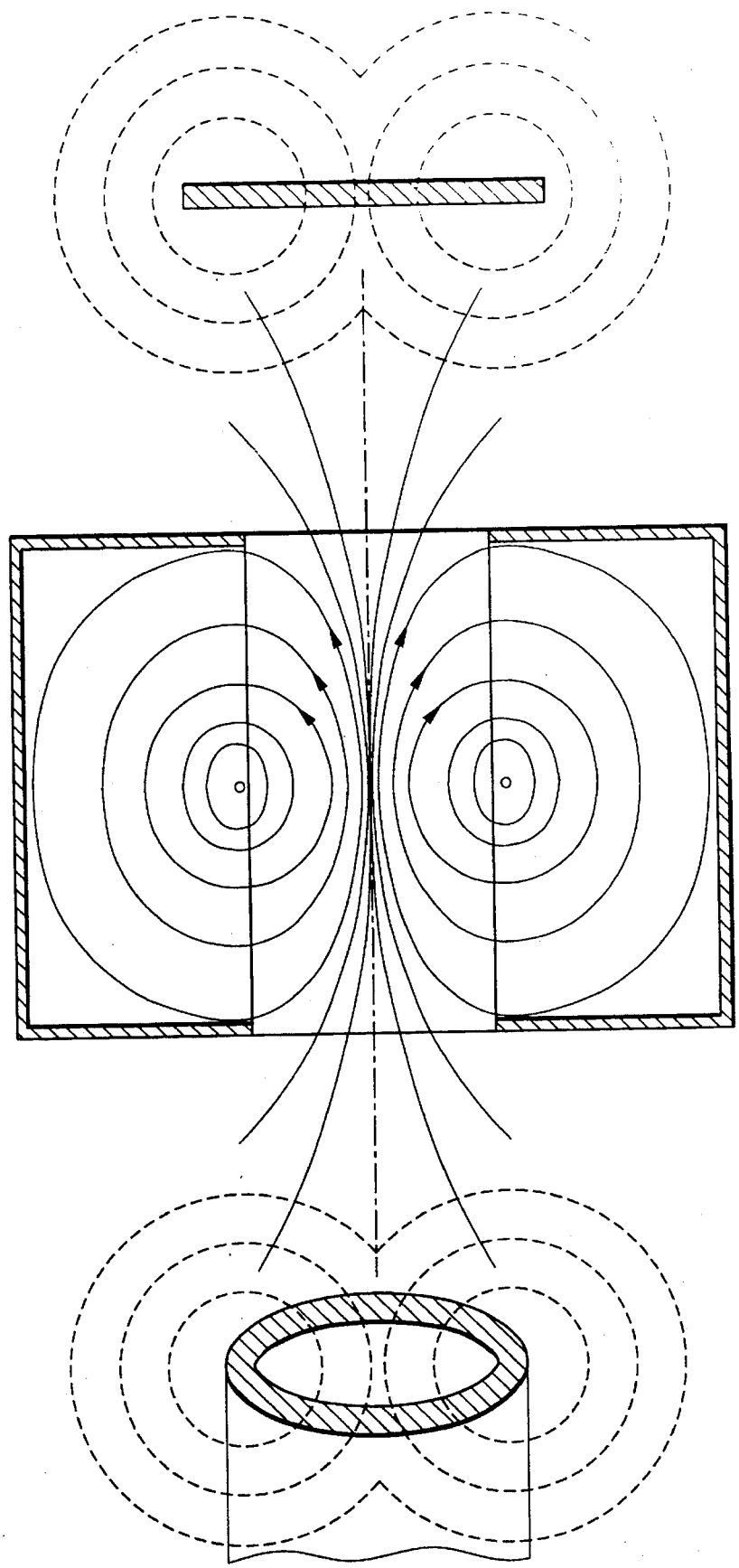
FIG. 3 is an end view of a standard metal detector showing the extent to which the field extends outside of the metal box and how it reacts with metal components.

Referring to FIGS. 1 to 3 a standard metal detector 10 comprises a balanced arrangement of coils 12 in the form of an a.c. bridge securely mounted in the centre of a metal enclosure 14. The coils enclose a detection zone 15. Apertures 16,18 are provided in opposite side walls 20,22 of the metal enclosure 14. These apertures 16,18 are co-axial with a similar spaced aperture 24 defined by the coils 12.

In use the upper surface 28 of a conveyor belt 30 passes through the apertures 16,18,24. Materials placed on the conveyor belt 30 will pass through the apertures 16,18,24 during which time any metal in the material will be detected.

FIG. 1 shows that the known type of metal detector has a large metal free zone. If any metal is located within the metal free zone then the sensitivity of the detector will be impaired. All of the surfaces within the metal enclosure 14 are non metallic. The insertion space in the production line is limited by the large metal free zone "MFZ" as is best illustrated in FIG. 2.

Should a metal component be located within the MFZ, as is shown in FIG. 3, and thus come within the influence of the primary field then a secondary field is generated which interfaces with the primary field and causes a false alarm.

Figure 4:
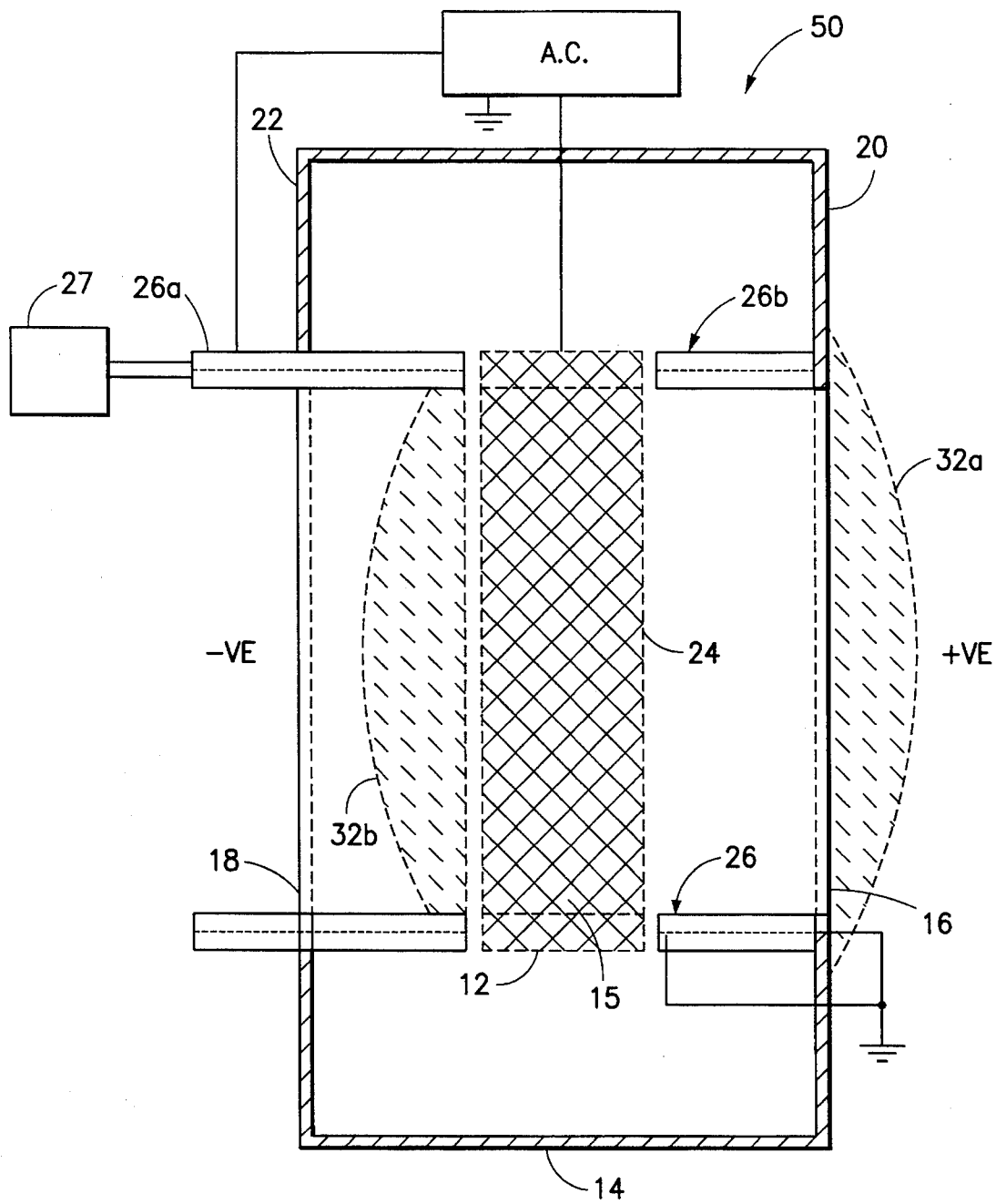
FIG. 4 is an end view partly in cross section of a metal detector in accordance with the invention showing how the primary field can be reduced and can even be negative, i.e. within the boundaries of the metal box.
Figure 5:
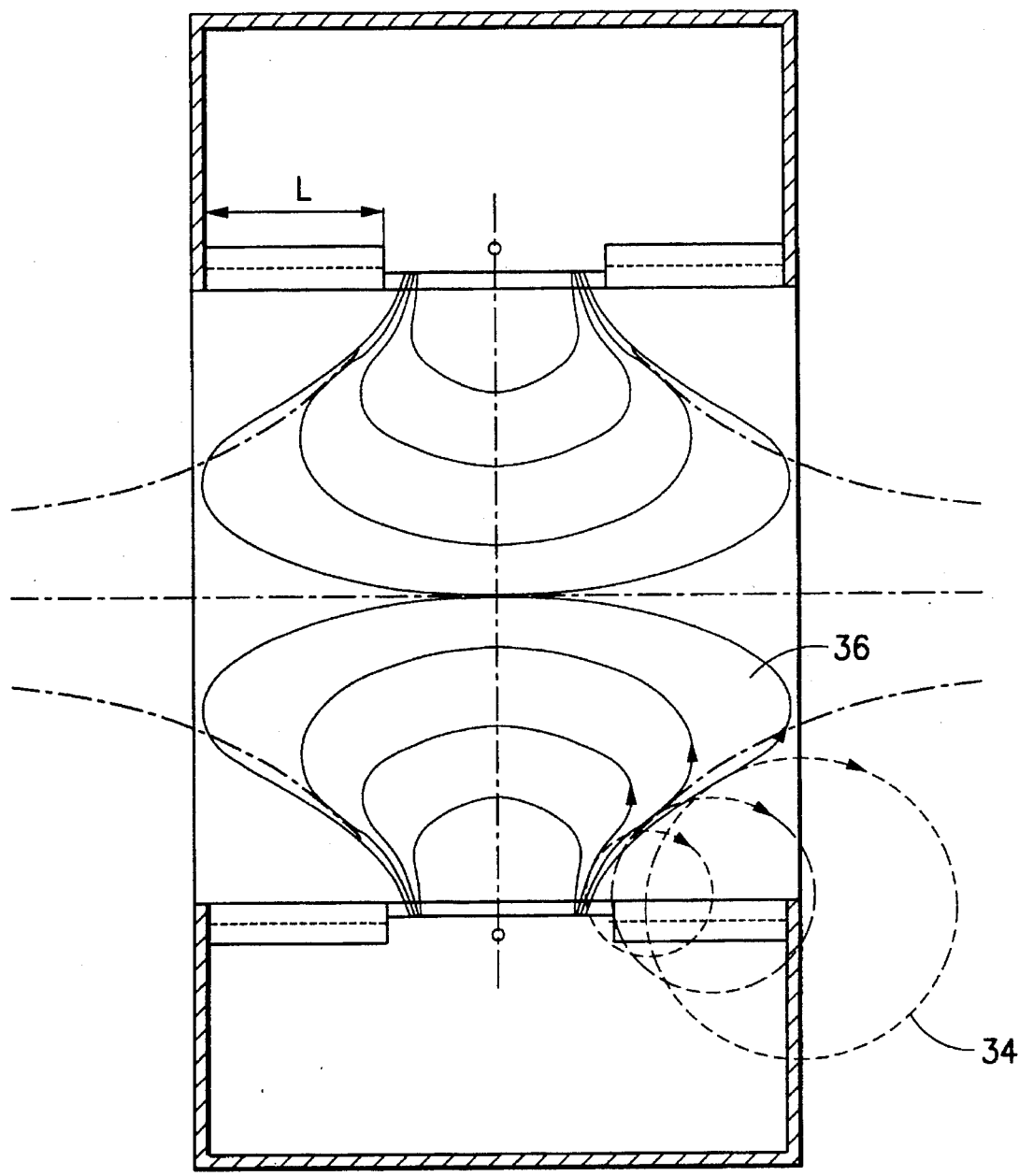
FIG. 5 is a cross sectional view of a zero metal free zone detector showing how the primary field is contained within the metal box by the secondary field.

Referring to FIGS. 4 and 5 a metal detector 50 in accordance with the invention is similar to that previously described except in that metal screening 26a,b in the form of metal tubes is provided between the aperture 24 and apertures 16,18.

Figure 4A:
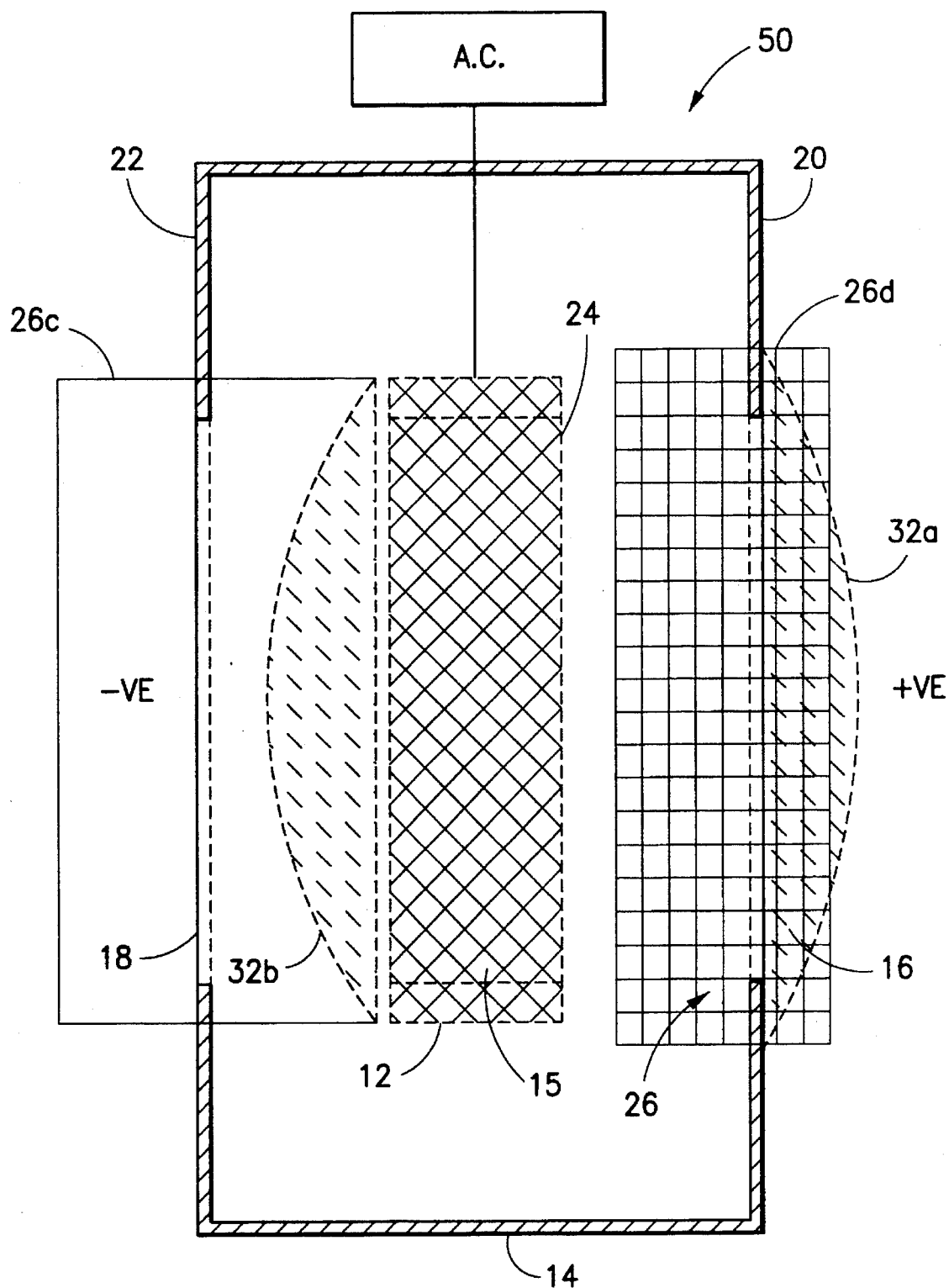
FIG. 4a is an end view partly in cross section of a second embodiment of the invention.

The metal screening 26a,b provides a secondary induced magnetic field which opposes the primary field and reduces the metal free zone 32 to a small positive value 32a or even to a negative value 32b such that large metal objects would have to be inside the aperture to cause any disturbance. A typical field arrangement is shown in FIG. 5 in which the secondary field 34 forces the primary field 36 back into the aperture limiting the response to external influences. Referring to FIG. 4a, there is shown a metal detector having a metal plate 26c and a metal screen 26d for generating the secondary field. As will be known to those skilled in the art, the presence of metal as detected by the detector of the invention can be indicated in a number of conventional ways. The detected metal disturbs the balanced coil arrangement in the form of a bridge. A signal is sent from the bridge to an indicator such as an alarm (not shown).

The metal detector of the present invention tends not to be influenced by large moving metal objects outside its enclosure and can be used in a much smaller space than conventional detectors. This enables these detectors to be used on machines and in places where known detectors cannot be successfully used.

Further advantages are offered by the detector of the present invention. For example this metal detector substantially eliminates the effects of electrical loops on the performance of the detector. This could be just as important as reducing MFZ. The loop effect is eliminated by limiting the distance or range of the primary field. This is done by generating a secondary field to interact with and cancel the primary field at distances from the detector where a loop may to be present.

Also the application of this invention reduces the external field to such a degree that 'cross talk' does not take place.

The efficiency or the effectiveness of this technique can be assessed in two ways:

1. By comparing the insertion gap required for a standard metal detector that will allow it to operate at full sensitivity, to that of a zero MFZ detector operating at the same sensitivity, and this can be shown to be between 2 and 4 times smaller for the zero MFZ detector.

Note: The insertion gap is the distance between moving metal components on a machine.

2. By comparing the highest sensitivity of a standard metal detector operating satisfactorily between moving or stationary metal components with the sensitivity of a zero MFZ detector.

The zero MFZ detector can operate at full sensitivity whereas the standard detector has to be reduced by a factor of approximately 10 times measured in units of metal particle size.

i.e. 1.0 mm diameter metal sphere detectable in a zero MFZ detector and 10 mm diameter metal sphere detectable in a standard detector.

It is to be understood that the above described embodiment is by way of illustration only. Many modifications and variations may be made.

For example the screening may be provided either outside the enclosure in addition to or in place of the screening provided inside the enclosure.

I claim:

1. A metal detector comprising a coiled conductor defining a channel extending therethrough, the coiled conductor being operative to be connected to an a.c. power supply so as to provide an a.c. generated primary electromagnetic field, the detector further comprising means for generating a secondary magnetic field for nullifying the primary field beyond a distance from the coiled conductor, the means for generating the secondary field being stationary, and at least a part of the means for generating the secondary field being located within the primary field and being located adjacent the coiled conductor, characterised in that the coiled conductor is located within a metal enclosure and at least a part of the means for generating the secondary magnetic field extends between the coiled conductor and the metal enclosure, the metal enclosure having apertures in opposed walls thereof, the apertures being aligned with the coil channel such that a material to be subjected to metal detection can be passed therethrough, the position of the means for generating the secondary magnetic field being such that it does not interfere with the passage of said material along the path of travel through the enclosure apertures and the coil channel.

2. A metal detector as claimed in claim 1, wherein the coiled conductor defines an aperture.

3. A metal detector as claimed in claim 2, wherein apertures are provided at opposite parts of the metal enclosure, the apertures being coaxial with the aperture through the coiled conductor.

4. A metal detector as claimed in claim 1, wherein a means for generating a secondary magnetic field is provided at opposite ends of the coiled conductor.

5. A metal detector as claimed in claim 1, wherein the means for generating a secondary magnetic field is wholly located within the enclosure.

6. A metal detector as claimed in claim 1, wherein at least a part of the means for generating a secondary magnetic field is located outside the enclosure.

7. A metal detector as claimed in claim 1, wherein the means for generating a secondary magnetic field comprises at least one second coil of conductive material.

8. A metal detector as claimed in claim 1, wherein said means for generating a secondary magnetic field comprises at least one second coil operative to be energised at the same frequency as the primary field coil conductor, but at opposite polarity.

9. A metal detector as claimed in claim 1, wherein the means for generating a secondary magnetic field comprises at least one coil which is short circuited and grounded.

10. A metal detector as claimed in claim 1 wherein the means for generating a secondary magnetic field comprises at least one of a metal plate, tube or screen.

* * * * *